US010860417B1

(12) United States Patent
Spirkl et al.

(10) Patent No.: US 10,860,417 B1
(45) Date of Patent: Dec. 8, 2020

(54) MULTIPLE MEMORY DIE TECHNIQUES

(71) Applicant: Micron Technology, Inc., Boise, ID (US)

(72) Inventors: Wolfgang Anton Spirkl, Germering (DE); Thomas Hein, Munich (DE); Peter Mayer, Neubiberg (DE); Michael Dieter Richter, Ottobrunn (DE); Martin Brox, Munich (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/530,469

(22) Filed: Aug. 2, 2019

(51) Int. Cl.
*G11C 29/00* (2006.01)
*G06F 11/10* (2006.01)
*G06F 3/06* (2006.01)

(52) U.S. Cl.
CPC .......... *G06F 11/1048* (2013.01); *G06F 3/061* (2013.01); *G06F 3/0658* (2013.01); *G06F 3/0659* (2013.01)

(58) Field of Classification Search
CPC .... G06F 11/1048; G06F 3/061; G06F 3/0658; G06F 3/0659
See application file for complete search history.

(56) References Cited

U.S. PATENT DOCUMENTS

| | | | |
|---|---|---|---|
| 7,978,516 B2 * | 7/2011 | Olbrich ................ | G11C 7/1063 365/185.11 |
| 9,336,112 B2 * | 5/2016 | Schushan ............ | G06F 11/3037 |
| 2019/0121560 A1 * | 4/2019 | Keeth ................ | G06F 11/1004 |

* cited by examiner

*Primary Examiner* — Samir W Rizk
(74) *Attorney, Agent, or Firm* — Holland & Hart LLP

(57) ABSTRACT

Methods, systems, and devices for multiple memory die techniques are described. A memory device may include multiple memory dies and may be configured to communicate with a host device. For example, each memory die may be coupled with a set of data pins that includes respective subsets of data pins (e.g., a set of eight data pins having two subsets of four data pins). Further, each memory die may have one or more auxiliary pins used for channel coding information for data communicated over one or more of the subsets of data pins. In some cases, each memory die may include one or more additional auxiliary pins, which may be used for channel coding information for a respective subset of data pins or multiple subsets of data pins. The channel coding information associated with the auxiliary pin(s) may include error detection code information, data coding information, or any combination thereof.

25 Claims, 11 Drawing Sheets

MULTIPLE MEMORY DIE TECHNIQUES

BACKGROUND

The following relates generally to a system that includes at least one memory device and more specifically to multiple memory die techniques.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

As memory devices are enhanced for improved performance, such as faster access operations and increased storage capabilities, various issues related to memory device and host device configurations may arise.

DETAILED DESCRIPTION

Figure 1:
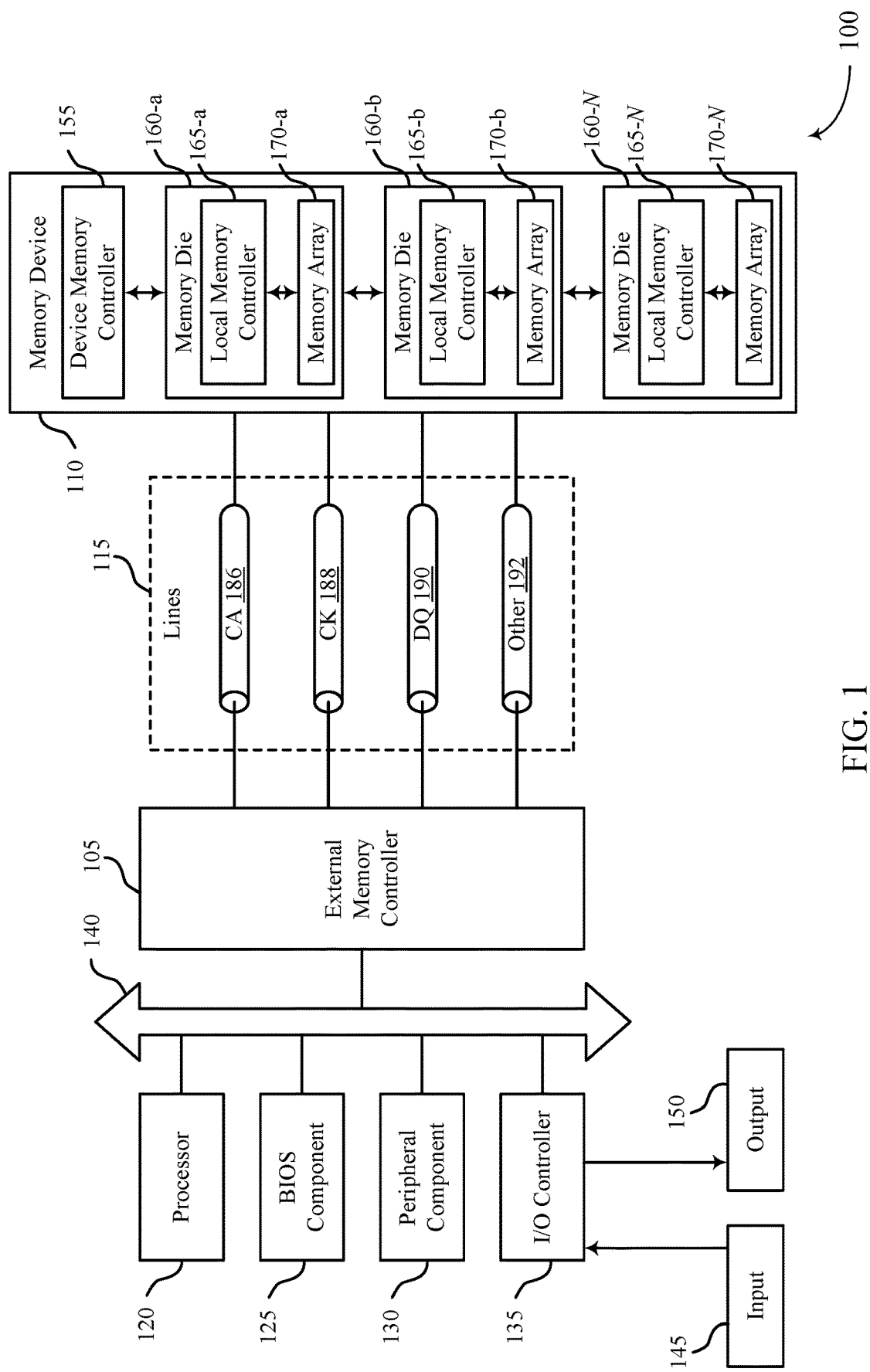
FIG. 1 illustrates an example of a system that supports multiple memory die techniques in accordance with examples as disclosed herein.

The architecture of memory systems, such as those including dynamic random access memory (DRAM) devices, may be configured to support different operational modes. For instance, a memory system may include a host device and one or more memory devices, and communications between the host device and the one or more memory devices may occur over multiple channels. In some cases, a channel may refer to a set of one or more lines via which data may be exchanged between a host device and a memory device. In some cases, a channel may refer to a logical entity used to exchange data over one or more lines between a host device and a memory device.

Based on the system configuration and operational mode, a memory device may concurrently communicate a different number of bits over each channel. As one example, a single memory device may communicate with a host device over two 16 bit wide channels (which may be referred to as an x16 (by 16) mode, full input/output (I/O) mode, or other like terminology). As used herein, a channel or other width expressed in bit units may refer to the number of lines included in the channel or other entity, and thus the number of bits able to be concurrently communicated via the channel or other entity assuming a binary modulation scheme (though other modulation schemes may also be used). In this example, communication may concurrently occur via 32 data lines, with 16 data lines per channel.

Additionally or alternatively, two memory devices may communicate with a host device over two x16 channels, but with each x16 channel split such that one x8 subset of the channel is coupled with one memory device and another x8 subset of the channel is coupled with the other memory device (which may be referred to as an x8 (by 8) mode, half I/O mode, or other like terminology). That is, two 16 bit wide channels may be used by the host device, but with each 16 bit wide channel split among the two memory devices (e.g., a first x8 subset of the channel coupled with the first memory device, and a second x8 subset of the channel coupled with the second memory device, with one x8 subset per channel used by the host device to communicate with each memory device). In such cases, the host device may communicate over 16 lines per channel but with each channel split between the two memory devices such that each memory device communicates over 8 lines per channel.

In any case, each x8 group of lines over which communication occurs may be associated with a respective auxiliary line for communicating error detection coding (such as an error detection code (EDC) line) as well as a respective auxiliary line for data coding (such as a data bus inversion (DBI) line, or other type of data coding line). Further, for memory devices having multiple memory dies, these configurations may be implemented using one channel per memory die or multiple channels per memory die, and each channel (and, in some cases, each x8 subset of a channel) may operate independently of each other (e.g., be independently addressable by the host device).

As demand for improved memory performance continues, there may be a number of factors that contribute to the design and configuration of memory devices. For instance, increasing a number of data pins (e.g., DQ pins) of a memory device may be undesirable due to physical constraints and other considerations (e.g., more data pins may increase the area of the memory device, while fewer data pins may restrict bandwidth). Additionally, while operational performance (e.g., the number of bits exchanged per pin or line as part of an access (e.g., read or write) operation) and capacity of memory devices improve or otherwise evolve, it may be desirable to ensure that a memory device is compatible with a range host devices to enable a broad range of applications and implementations without also requiring enhanced host device design (e.g., with requiring that a host device be capable of matching a maximum performance level supported by the memory device). Thus, various factors may be taken into account when the performance of memory devices is improved or otherwise altered (e.g., doubling the number of bits exchanged per pin or line as part of an access (e.g., read or write) operation).

As described herein, various configurations of memory devices may enable enhanced data access rates while ensuring broad compatibility with other devices, among other benefits that may be appreciated by one of ordinary skill in the art. As an example, a memory device may be configured to communicate information using increased amounts of data per-pin per-access and/or using an increased number of channels (e.g., as compared to systems using two channels), including channels that may be divided with a sub-x8 (e.g., sub-byte) granularity (e.g., to support splitting across multiple memory devices from the perspective of a host device).

As one example, as part of a memory system, a memory device may communicate with a host device over multiple (e.g., four) 8 bit wide channels, where each channel may correspond to a respective memory die at the memory device. Additionally or alternatively, multiple memory devices may communicate with the host device as part of a memory system. In such cases, each memory device may communicate via a 4 bit wide subdivision of a channel (which may also be referred to as a nibble) within a respective channel of a set of channels (e.g., four channels), where each channel may correspond to a respective memory die at the memory device. That is, for example, four 8 bit wide channels may be used by the host device, but with each 8 bit wide channel split among two memory devices (e.g., a nibble-wide portion of the channel coupled with the first memory device, and a second nibble-wide portion of the channel coupled with the second memory device, with one nibble-wide portion per channel used by the host device to communicate with each memory device).

In such cases, various auxiliary pin and line configurations may be used for each 8 bit wide channel and the nibbles therein (e.g., where auxiliary pins may be dedicated to some subsets of data pins at the memory device). For example, a set of auxiliary pins (e.g., an EDC pin and a DBI pin) at the memory device may be dedicated to a subset of four data pins of the memory device. In other examples, a single auxiliary pin at the memory device may be dedicated to a subset of four data pins (e.g., where both EDC and DBI information may be carried together on a bi-directional auxiliary line). Additionally or alternatively, a set of one or more auxiliary pins may be configurable to be dedicated to a set of data pins or dedicated to a subset thereof at the memory device (e.g., an EDC pin and a DBI pin—or a single auxiliary pin—may be configurable as either dedicated to a set of 8 data pins (two subsets of four data pins), or as dedicated to one of the two subsets of four data pins). Through the various configurations of the memory device described herein, a memory system may support an increased quantity of bits communicated to/from a host device per data line during (e.g., in connection with) an access operation without increasing an area of the memory device, and while maintaining compatibility with a wide range of host devices, among other benefits.

Features of the disclosure are initially described in the context of a memory system and memory die as described with reference to FIGS. 1 and 2. Features of the disclosure are described in the context of memory device configurations as described with reference to FIGS. 3-7. These and other features of the disclosure are further illustrated by and described with reference to an apparatus diagram and flowcharts that relate to multiple memory die techniques as described with references to FIGS. 8-11.

FIG. 1 illustrates an example of a system 100 that utilizes one or more memory devices in accordance with examples as disclosed herein. The system 100 may include an external memory controller 105, a memory device 110, and a plurality of lines 115 (e.g., data and/or auxiliary lines) coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host device or host device. In some examples, system 100 is a graphics card. The host device may communicate with a memory device 110 to request or transmit data, or perform other functions. The host device and the memory device 110 may couple with each other via one or more lines, pins, or other connections to transmit data and control information.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dies 160 (e.g., memory chips) to support a desired or specified capacity for data storage. The memory device 110 including two or more memory dies may be referred to as a multiple memory die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dies 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dies 160 (e.g., memory die 160-a, memory die 160-b, and/or any quantity of memory dies 160-N). In a 3D memory device, a plurality of memory dies 160-N may be stacked on top of one another or next to one another. In some cases, memory dies 160-N in a 3D memory device may be referred to as decks, levels, layers, or memory dies. A 3D memory device may include any quantity of stacked memory dies 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dies 160, or the processor 120. In some cases, the memory device 110 may receive data and/or commands from the host device or the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120 of the host device.

The external memory controller 105 may be configured to enable communication of information, data, and/or commands between components of the system 100 (e.g., the processor 120 of the host device) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may, in some cases, be performed by the external memory controller 105 (either separate from or as included in the processor 120).

The components of the system 100 may exchange information with the memory device 110 using a plurality of lines 115, which may be grouped into channels and subdivisions thereof (e.g., nibble-wide subdivisions) as described herein, and which may also include one or more auxiliary lines as described herein. In some examples, the lines 115 may enable communications between the external memory controller 105 and the memory device 110. Each line 115 may include a signal path, which may include one or more transmission mediums (e.g., conductors) between terminals associated with the components of system 100. For example, a line 115 may include a first terminal including a pin or pad (which may generically be referred to as a pin, regardless of physical shape) at external memory controller 105 and a pin at the memory device 110. A pin may be an example of a conductive input or output point of a device of the system 100, and a pin may be configured to act as part of a line 115.

In some cases, a pin of a terminal may be part of a signal path of the line 115. Additional signal paths may be coupled with a terminal of a line for routing signals within a component of the system 100. For example, the memory device 110 may include signal paths (e.g., signal paths internal to the memory device 110 or its components, such as internal to a memory die 160) that route a signal from a terminal of a line 115 to the various components of the memory device 110 (e.g., a device memory controller 155, memory dies 160, local memory controllers 165, memory arrays 170).

Lines 115 (and associated signal paths and terminals) may be dedicated to communicating specific types of information. In some cases, lines 115 may be aggregated into channels or subdivisions thereof. For example, a data channel may include any number of data lines (DQ lines 190) and thus may be x4 (e.g., including four DQ lines 190), x8 (e.g., including eight DQ lines 190), x16 (including sixteen DQ lines 190), and so forth. Signals communicated over at least some of the lines 115 may use a double data rate (DDR) timing scheme. For example, some symbols of a signal may be registered on a rising edge of a clock signal and other symbols of the signal may be registered on a falling edge of the clock signal. Signals communicated over channels may also use single data rate (SDR) signaling. For example, one symbol of the signal may be registered for each clock cycle.

In some cases, the lines 115 may include one or more command and address (CA) lines 186. The CA lines 186 may be configured to communicate commands between the external memory controller 105 and the memory device 110 including control information associated with the commands (e.g., address information). For example, one or more CA lines 186 may be used to communicate a read command with an address of the desired data. In some cases, the symbols carried by CA lines 186 may be registered (e.g., strobed) on a rising clock signal edge and/or a falling clock signal edge. In some cases, CA lines 186 may be grouped into CA channels, which may include any quantity of signal paths to decode address and command data (e.g., eight or nine signal paths). In some cases, a CA channel may correspond to (e.g., be dedicated) to a data channel. In other cases, a data channel associated with information carried via a CA channel may be indicated using (e.g., based on the status of) a channel select (CS) line.

In some cases, the lines 115 may include one or more clock signal (CK) lines 188. The CK lines 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK lines 188 may be configured accordingly. In some cases, the clock signal may be single ended. A CK line 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the lines 115 may include one or more data (DQ) lines 190, which may be grouped into channels (data channels) and subdivisions thereof, as described herein. The data lines 190 may be configured to communicate data and/or control information between the external memory controller 105 and the memory device 110. For example, the data lines 190 may communicate information (e.g., bi-directional) to be written to the memory device 110 or information read from the memory device 110.

In some cases, the lines 115 may include one or more other lines 192 that may be dedicated to other purposes. These other lines 192 may include any quantity of signal paths. In some cases, the other lines 192 may include one or more write clock signal (WCK) lines, which may be grouped into one or more WCK channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

The lines 115 may couple the external memory controller 105 with the memory device 110 using a variety of different architectures. Examples of the various architectures may include a bus, a point-to-point connection (e.g., a P2P connection), a crossbar, a high-density interposer such as a silicon interposer, or signal paths formed in an organic substrate or some combination thereof. For example, in some cases, the signal paths may at least partially include a high-density interposer, such as a silicon interposer or a glass interposer.

In some cases, the other lines 192 may include one or more auxiliary lines. Auxiliary lines may include EDC lines associated with one or more EDC pins on the memory device 110. The EDC lines may be configured to communicate error detection signals, such as checksums, to improve system reliability. The EDC lines may also communicate tracking information, clock information, cyclic redundancy check (CRC) codes, and the like). An EDC line may include any quantity of signal paths, and in some cases, may be unidirectional (e.g., from the memory device 110 to the external memory controller 105). In some cases, the other lines 192 may include one or more DBI lines associated with one or more DBI pins of the memory device 110. The DBI lines may be configured to carry information related to data encoding, which may facilitate efficient data transfer, reduce power consumption, and the like. An auxiliary channel, such as a channel including DBI lines, may include any quantity of signal paths. In some cases, the DBI channel may be unidirectional (e.g., from the external memory controller 105 to the memory device 110), or in some cases, may be bidirectional. In some cases, a single auxiliary line may communicate information associated with (e.g., that may otherwise be carried by) both EDC lines and DBI lines (e.g., a single auxiliary line may combine the functionality of an EDC line and a DBI line).

In some examples, the external memory controller 105 may communicate with multiple (e.g., two) memory devices 110 each having multiple memory dies 160. As an example, at least two memory devices 110 may be located on different (opposite) sides of a PCB, which may be referred to as a clamshell configuration or clamshell layout. In some cases, using multiple memory devices 110 may increase the memory storage capacity associated with the memory system, such that the external memory controller 105 may have a greater number of memory devices 110 available for information storage. In some memory systems with two memory devices 110, a host device may communicate with both memory devices 110 as if communicating with a single memory device 110 (e.g., a single package) with twice the storage capacity, while communication bandwidth (e.g., data rate, data line 190 count from the host device perspective) may stay the same. In such cases, communications between the external memory controller 105 and the memory devices 110 may be performed in an operational mode referred to as a half I/O communications mode, x8 mode, or other similar terminology.

Signals communicated over the lines 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information per symbol. Multi-symbol modulation schemes and symbols may alternatively be referred to as non-binary, multi-bit, or higher-order modulation schemes and symbols. In some cases, multi-symbol modulation schemes may increase the data rate with which data may be communicated via one or more lines 115. Additionally or alternatively, the data rate with which data may be communicated via one or more lines 115 may be increased by increasing a baud rate and/or increasing the amount of lines 115. A higher data rate per line 115 may result in a higher data rate for access commands, such as read or write commands.

In some cases, it may be desirable to increase the number of data bits communicated per data line 190 per access operation, but it may not be desirable to increase a total amount of data received from or provided to a host device (e.g., external memory controller 105) per access operation. The total amount of data received from or provided to a host device per access operation may be referred to as a data package size, a packet size, or a codeword size. In some cases, the packet size for a channel may be a product of the number of data bits communicated per data line 190 per access operation, the channel width (e.g., number of data lines 190 included in the data channel), and the burst length (e.g., number of symbols or unit intervals) per access operation.

For example, it may not be desirable to increase the packet size due to constraints on other devices communicating with the memory device 110 (such as external memory controller 105). For example, the external memory controller 105 may be a legacy device, a low-power device, a low-throughput device, or otherwise configured to process lower amounts of data per read or write operation. Additionally or alternatively, the external memory controller 105 may process data at a lower data rate for efficiency, power savings, or precision purposes. Therefore, as described herein, the memory device 110 and the external memory controller 105 may be configured with a greater number of independently addressable channels but with reduced channel widths, and with one or more subdivisions thereof for further enhanced flexibility. For example, the memory device 110 may also support use of either a full I/O mode or a half I/O mode to transfer data between the memory device 110 and the host device over the data channels.

In one example, any number of x8 data channels may be used to communicate between the one or more memory devices 110 and the host device (e.g., as opposed to two data channels). In a full I/O mode, the data pins associated with the one or more x8 data channels supported by a memory device 110 may each be fully utilized—that is, for a given x8 data channel operated in full I/O mode, data may be exchanged with the memory device 110 via each of eight data pins associated with the x8 channel. For example, a memory device 110 may support four x8 data channels, each of which may be operated in a full I/O mode. In a partial (e.g., half) I/O mode, the data pins of one or more x8 data channels supported by the memory device 110 may each be partially utilized (e.g., a subset of the data pins of an x8 data channel may be utilized). For example, for a given x8 data channel operated in half I/O mode, data may be exchanged with the memory device 110 via four of the eight data pins associated with the x8 channel, and the other four of the eight data pins associated with the x8 channel may be unutilized. In a half I/O mode, each x8 channel may be associated with two memory dies 160, where each memory die 160 is at a different memory device 110. For example, four data lines of the x8 channel may couple the host device and a first memory die 160 at a first memory device 110, and the remaining four data lines of the x8 channel may couple the host device and a second memory die 160 at a second memory device 110.

In one example, each memory die 160 of a memory device 110 may be coupled with a set of eight data pins of the memory device 110, the set of eight data pins including two subsets of four pins, with each data pin corresponding to a data line 190. Moreover, each memory die 160 of a respective memory device 110 may also be coupled with auxiliary pins including one or more EDC pins, DBI pins, or pins combining the functionality of EDC pins and DBI pins. In such cases, and as described in further detail herein, these auxiliary pins may be dedicated to different subsets of data pins.

Figure 2:
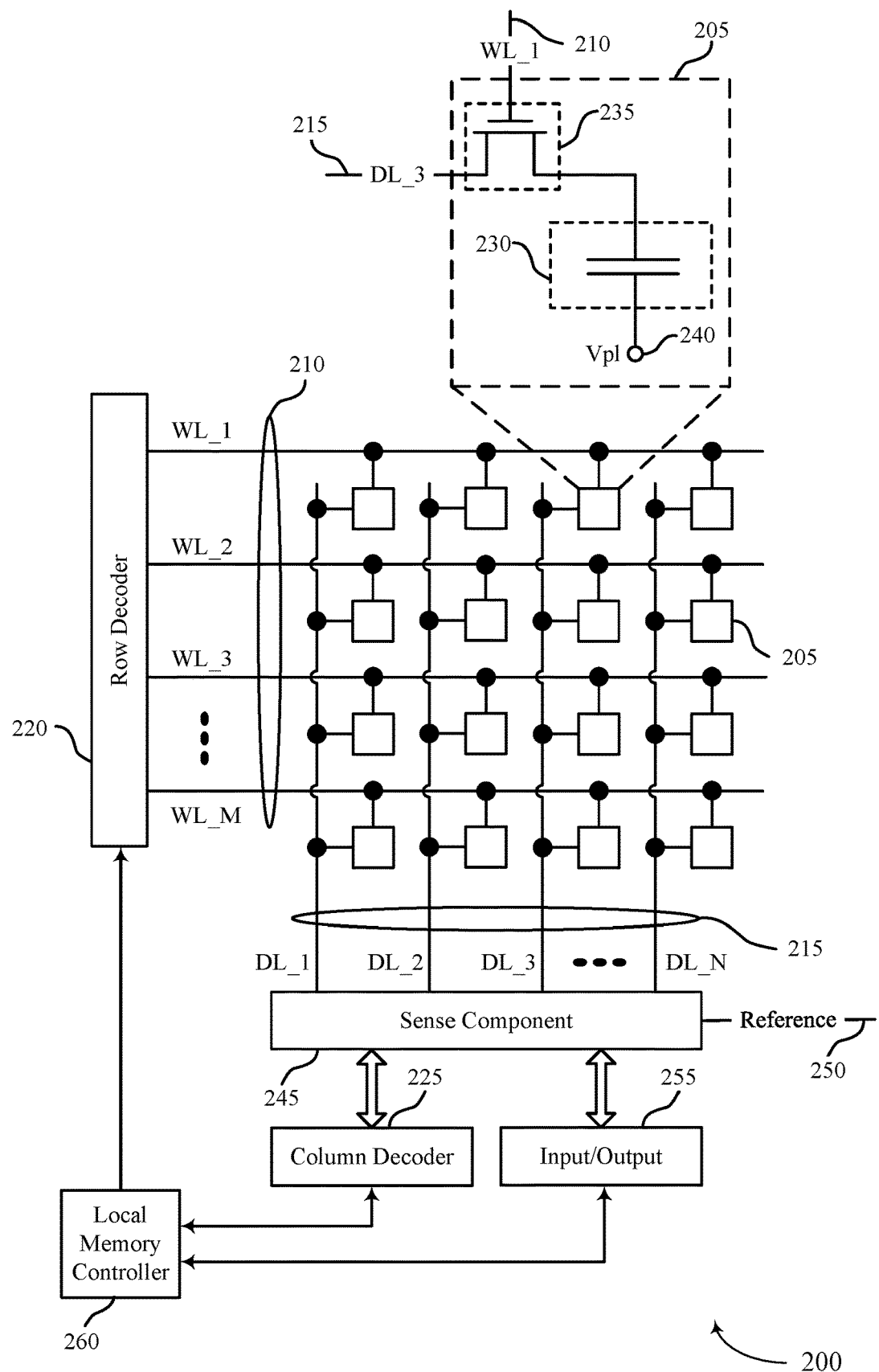
FIG. 2 illustrates an example of a memory device that supports multiple memory die techniques in accordance with examples as disclosed herein.

FIG. 2 illustrates an example of a memory device 200 in accordance with examples as disclosed herein. The memory device 200 may be an example of a memory dies 160 as described with reference to FIG. 1. In some cases, the memory device 200 may be referred to as a memory chip, a memory device, or an electronic memory apparatus. The memory device 200 may include one or more memory cells 205 that are programmable to store different logic states. Each memory cell 205 may be programmable to store two or more states. For example, the memory cell 205 may be configured to store one bit of information at a time (e.g., a logic 0 or a logic 1). In some cases, a single memory cell 205 (e.g., a multi-level memory cell) may be configured to store more than one bit of information at a time (e.g., a logic 00, logic 01, logic 10, or a logic 11).

A memory cell 205 may store a charge representative of the programmable states in a capacitor. DRAM architectures may include a capacitor that includes a memory dielectric material to store a charge representative of the programmable state. In other memory architectures, other storage devices and components are possible. For example, nonlinear (e.g., ferroelectric) memory dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory device 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory device 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a memory dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of the memory cell 205 may be provided as an output of the sense component 245 (e.g., to an input/output 255), and may indicate the detected logic state to another component of a memory device 110 that includes the memory device 200, such as a device memory controller 155 (e.g., directly or using the local memory controller 260).

The local memory controller 260 may control the operation of memory cells 205 through the various components (e.g., row decoder 220, column decoder 225, and sense component 245). The local memory controller 260 may be an example of a local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 of a host device (or a device memory controller 155 described with reference to FIG. 1), translate the commands and/or data into information that can be used by the memory device 200, perform one or more operations on the memory device 200, and communicate data from the memory device 200 to the external memory controller 105 of the host device (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory device 200. In general, the amplitude, shape, or duration of an applied voltage or current discussed herein may be adjusted or varied and may be different for the various operations discussed in operating the memory device 200.

In some cases, the local memory controller 260 may be configured to perform a write operation (e.g., a programming operation) on one or more memory cells 205 of the memory device 200. During a write operation, a memory cell 205 of the memory device 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state. In one example, a host device may send a write command to the local memory controller 260, where the command may be associated with a certain data rate.

In some cases, the local memory controller 260 may be configured to perform a read operation (e.g., a sense operation) on one or more memory cells 205 of the memory device 200. During a read operation, the logic state stored in a memory cell 205 of the memory device 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation. In one example, a host device may send a read command to the local memory controller 260, where the command may be associated with a certain data rate.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed. In one example, a host device may send a re-write command to the local memory controller 260, where the command may be associated with a certain data rate.

In some cases, it may be desirable to increase the number of data bits communicated per data line per access operation, but it may not be desirable to increase a total amount of data (e.g., data package size) received from or provided to a host device per access operation. In some cases, the packet size for a channel may be a product of the number of data bits communicated per data line per access operation, the channel width (e.g., number of data lines included in the data channel), and the burst length (e.g., number of symbols or unit intervals) per access operation.

For example, it may not be desirable to increase the packet size due to constraints on other devices communicating with the memory device 200 (such as the host device). For example, the host device may be a legacy device, a low-power device, a low-throughput device, or otherwise configured to process lower amounts of data per read or write operation. Additionally or alternatively, the host device may process data at a lower data rate for efficiency, power savings, or precision purposes. Therefore, as described herein, the memory device 200 and the host device may be configured with a greater number of independently addressable channels but with reduced channel widths. The memory device 200 may also support use of either a full I/O mode or a half I/O mode to transfer data between the memory device 200 and the host device over the data channels.

Accordingly, memory device 200 may be configured to support a data channel that includes a reduced number of data lines, and in some cases may support or may be included in a device that supports an increased number of such data channels. In one example, memory device 200 may be coupled with (e.g., the input/output 255 may be coupled with) a set of eight data pins of a memory device 110 that includes the memory device 200. The set of eight data pins may include two subsets of four pins. In a full I/O mode, both of the subsets of four data pins coupled with the memory device 200 may be in turn be coupled with the host device, and the set of eight data pins may correspond to (e.g., be included in) a channel. In other examples, such as examples using a half I/O mode, one of the subsets of four data pins coupled with the memory device 200 may in turn be coupled with the host device, with one set being unconnected (e.g., floating). Here, the host device may communicate with the memory device 200 via a first set of four data lines coupled with the one subset of four data pins, and may communicate with a second memory device 200 via a second subset of four data lines, where the first subset of four data line and the second subset of four data lines collectively may correspond to (e.g., be included in) the channel. The memory device 200 may also be coupled with one or more EDC pins, DBI pins, or pins combining the functionality of EDC pins and DBI pins.

Figure 3:
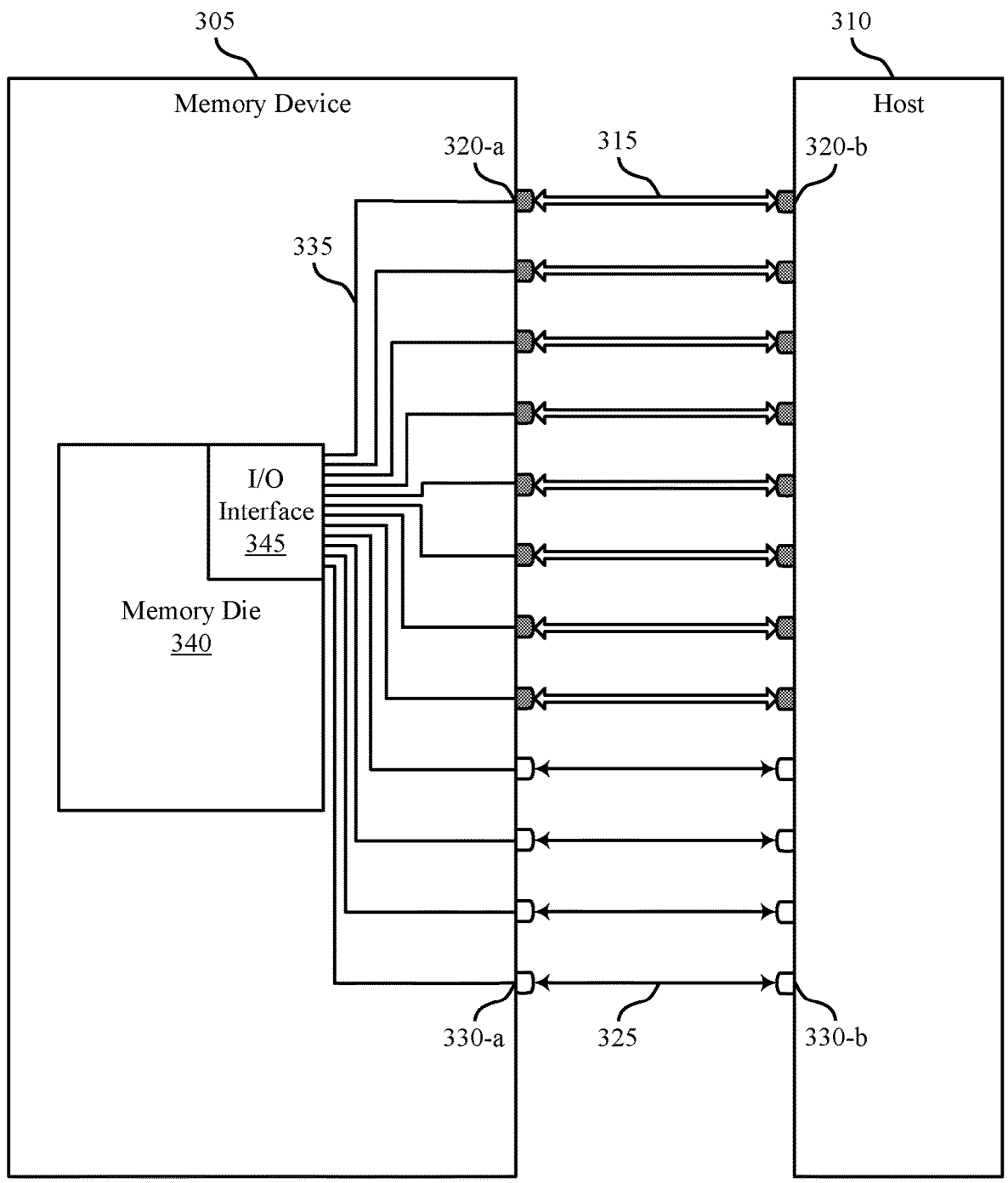
FIG. 3 illustrates an example of a device configuration that supports multiple memory die techniques in accordance with examples as disclosed herein.

FIG. 3 illustrates an example of a device configuration 300 that supports multiple memory die techniques in accordance with examples as disclosed herein. Device configuration 300 may be an example of a communications configuration of a memory device 305, including point-to-point connections to a host device 310. In some cases, a memory device 305 may be, include, or be included in an example of memory device 110 or 200, as described with reference to FIGS. 1 and 2. In some cases, the host device 310 and the memory device 305 together may implement aspects of memory device 110 or 200, as described with reference to FIGS. 1 and 2. In some cases, memory device 305 may be an example of a DRAM memory device. In some examples, memory device 305 and host device 310 may employ device configuration 300 to transfer data corresponding to a memory command (e.g., read, write, rewrite, etc.).

Memory device 305 may include one or more memory dies 340 (e.g., memory device 305 may contain any number of memory dies 340), which may be examples of a memory die described with reference to FIG. 1. Memory device 305 may also be configured with one or more data pins 320, which may be operable to transfer data, and one or more auxiliary pins 330, which may be operable to transfer control and other information (e.g., EDC or DBI information). In some cases, an auxiliary pin 330 (or multiple auxiliary pins 330) may be dedicated to one or more data pins 320. A data pin 320 or an auxiliary pin 330 may be an example of a pin, a ball, a connector, or the like.

The memory die 340 may store data in one or more memory cells and may include an I/O interface 345 which may be used to transfer and receive data from the host device 310. For example, I/O interface 345 may be coupled with one or more electrical connections 335, which may couple the I/O interface 345 to one or more data pins 320 and/or one or more auxiliary pins 330.

A data pin 320 may be coupled with the host device 310 via a data line 315, which may represent an electrical connection (e.g., a soldered connection, a printed circuit board (PCB) connection, etc.) between the memory device 305 and the host device 310 (e.g., a DQ line 190). Similarly, an auxiliary pin 330 may be coupled with the host device 310 via an auxiliary line 325, which may represent an electrical connection between the memory device 305 and the host device 310 (e.g., a line 115). For example, a data pin 320-a at the memory device 305 may be coupled with a data pin 320-b at the host device 310 via a data line 315, and an auxiliary pin 330-a at the memory device 305 may be coupled with an auxiliary pin 330-b at the host device 310 via an auxiliary line 325. Data pins 320 and auxiliary pins 330 at the host device 310 may interface with an I/O component of the host device, where the host device 310 may transfer and/or receive data via the I/O component. Each data line 315 and auxiliary line 325 may connect the memory device 305 and the host device 310 via a P2P connection, such that each data pin 320 or auxiliary pin 330 at the memory device 305 may be coupled with one data pin 320 or auxiliary pin 330 at the host device 310. In some cases, the memory die 340 may be associated with one auxiliary pin 330, or in other cases, the memory die 340 may be associated with two auxiliary pins 330, four auxiliary pins 330, or other quantities of auxiliary pins 330.

A memory die 340 may operate in a full I/O mode, where all data pins 320-a associated with the memory die 340 may be coupled with the host device 310 (e.g., via data lines 315). Additionally or alternatively, a memory die 340 may operate in a half I/O mode, or a clamshell mode, where half of the data pins 320-a associated with the memory die 340 may be coupled with the host device 310 (e.g., via data lines 315). In one example, a memory die 340 may be associated with eight data pins 320-a and up to four auxiliary pins 330-a for communication with the host device 310.

In some examples, a memory device 305 may be configured such that eight data pins 320 are an independently-addressable entity for data transfer. An independently-addressable entity may be associated with a data channel (e.g., eight data pins 320 may be associated with a channel). A channel may represent a group of independently-addressable data lines 315 (e.g., eight data pins 320) or may represent a logical entity for data transfer. A channel may be associated with one or more auxiliary pins 330 and corresponding auxiliary lines 325. In some cases, the eight data pins 320 associated with one channel may correspond to one memory die 340 (e.g., in a full I/O mode), or in other cases, one set of four data pins 320 may correspond to a first memory die 340 and one set of four data pins 320 may correspond to a second memory die 340 (not shown) (e.g., in half I/O mode). Each memory die 340 of a memory device 305 may therefore be associated with two sections of data pins 320 (e.g., two sections of four data pins 320), such that one of the two sections (e.g., four data pins 320) may be coupled with the host device 310 in a half I/O mode, and both of the two sections (e.g., eight data pins 320) may be coupled with the host device 310 in a full I/O mode.

An access operation (e.g., a read or write operation) may include transmitting data over the data lines 315 of a channel. For each access operation, either the host device 310 or a memory device 305 may transfer a number of bits of data via each data line 315 associated with a channel. As such, for each access operation, the data lines of one channel may carry a number of bits, which may be referred to as a data package size, equal to the multiple of the number of data lines 315 associated with the channel and the number of bits transferred via each data line 315. For example, in connection with one read or write operation, one channel that includes 8 data lines 315, each of which carries 32 bits per read or write operation, may carry a data package that includes 256 bits or 32 bytes. As described herein, channels may be independent, and access operations may be independently performed (and thus independent data packages exchanged) over different channels.

In some cases, the memory device 305 and/or the host device 310 may be configured to communicate a relatively high amount of data per data line 315 per access command (e.g., 32 bits per data line 315 per access command, as opposed to, e.g., 16 bits). For example, an associated baud rate may be increased, or the order of a modulation scheme may be increased, or both, to communicate the relatively high amount of data per data line per access command. However, in some cases, an unchanged data package size may be desired. For example, host device 310 may be a legacy device, a low-power device, a low-throughput device, or may otherwise be configured to process a fixed amount of data per read or write operation. Additionally or alternatively, host device 310 may process data at a lower data rate for efficiency, power savings, or precision purposes. Therefore, in some cases, the memory device 305 and the host device 310 may be configured to communicate over channels with a relatively low number of data lines 315 per channel (e.g., eight data lines 315 per channel, as opposed to, e.g., 16).

Figure 4:
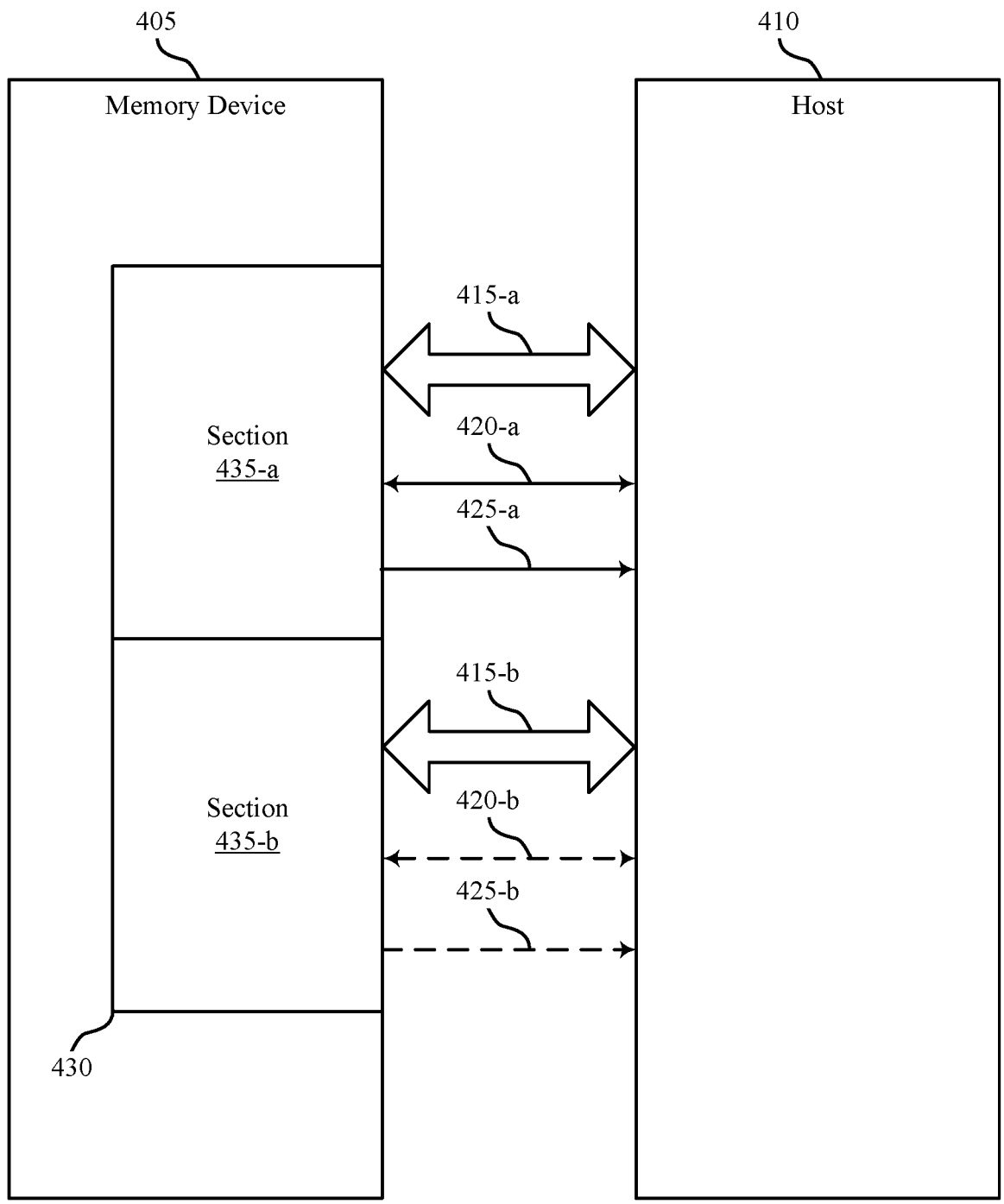
FIG. 4 illustrates an example of a device configuration that supports multiple memory die techniques in accordance with examples as disclosed herein.

FIG. 4 illustrates an example of a device configuration 400 that supports multiple memory die techniques in accordance with examples as disclosed herein. Device configuration 400 may be an example of a communications configuration of a memory device 405, including P2P connections to a host device 410. In some cases, a memory device 405 may be, include, or be included in an example of memory device 110, 200, or 305 as described with reference to FIGS. 1-3. In some cases, the host device 410 and the memory device 405 together may implement aspects of memory device 110 or 200, as described with reference to FIGS. 1 and 2. In some cases, memory device 405 may be an example of a DRAM memory device. Memory device 405 and host device 410 may employ device configuration 400 to transfer data in a full I/O mode or a half I/O mode (e.g., clamshell mode), or any combination thereof.

As described with reference to FIG. 3, a channel for data transfer between a memory device 405 and a host device 410 may be associated with a number of data lines 415 and associated with one or more auxiliary lines (e.g., DBI lines 420 and/or EDC lines 425). A channel may be a logical or physical entity used to transfer data between the memory device 405 and the host device 410 using a full I/O mode or a half I/O mode. In one example of a full I/O mode, a channel may include eight data lines 415, where the eight data lines 415 may be coupled with one memory die 430 of the memory device 405 (e.g., via data pins and device connections to the memory die 430). In one example of a half I/O mode, a channel may include eight data lines 415, where four of the data lines 415 may be coupled with a first memory die 430 and four of the data lines 415 may be coupled with a second memory die 430. In some modes, the host device 510 may also be coupled with a second memory device (not shown). For example, the host device 410 may be coupled with a memory die 430 of memory device 405 via four data lines 415, a DBI line 420, and an EDC line 425, and may be coupled with a memory die 430 on the second memory device in a similar manner.

A memory die 430 on a memory device 405 may include one or more independent I/O sections 435 (e.g., including sections 435-a and 435-b) that may individually transmit, receive, or operate in a silent mode. Each section 435 of the memory die 430 may be coupled with a number of data pins associated with a channel (e.g., coupled with four pins, which in some cases may each be a subset of a set of eight pins associated with the channel). Each section 435 of the memory die 430 may also be coupled with a corresponding DBI line 420 and a corresponding EDC line 425 (e.g., via auxiliary pins and device connections to the memory die 430). For example, section 435-a may be coupled with one auxiliary pin corresponding to DBI line 420-a, one auxiliary pin corresponding to EDC line 425-a, and four data pins corresponding to four data lines 415-a (e.g., pins for half of the data lines 415-a corresponding to a channel). Similarly, section 435-b may be coupled with one auxiliary pin corresponding to DBI line 420-b, one auxiliary pin corresponding to EDC line 425-b, and four data pins corresponding to four data lines 415-b. In such cases, each DBI line 420 and each EDC line 425 may be dedicated to transfer auxiliary information associated with the respective data transferred via data lines 415 of the same section 435.

Additionally or alternatively, one section 435 of the memory die 430 (e.g., section 435-b) may not be coupled with any auxiliary pins, but may be coupled with four data pins corresponding to four data lines 415-b. In such cases, DBI line 420-a and EDC line 425-a may be dedicated to transfer auxiliary information associated with the data transferred via both data lines 415-a and data lines 415-b. In some cases, where one section 435 is not coupled with any auxiliary pins, memory device 405 may be configured with one set of auxiliary pins associated with each memory die 430, which may simplify manufacturing and setup.

In some cases, benefits may be realized from a memory device 405 configured with two sets of auxiliary pins per channel that may each be coupled with the memory die 430. For example, in a full I/O mode or a half I/O mode, the host device 410 may be coupled with one or both of DBI lines 420-a and 420-b and one or both of EDC lines 425-a and 425-b. In cases where the host device 510 is coupled with both DBI lines 420-a and 420-b and/or both EDC lines 425-a and 425-b, the two DBI lines 420 and EDC lines 425 may be leveraged to simplify control transmissions, increase space for encoding, and transmit additional information associated with an access command (e.g., increase functionality of a DBI line 420 and/or an EDC line 425 due to extra bandwidth). In some cases, an access command may cause the memory device 405 to read or write 32 bits of information per data line 415, such that data lines 415-a and 415-b may each transfer 128 bits per access command (e.g., 32 bits over four data lines 415). The total available number of bits on the I/O of each section 435 (e.g., via an EDC line 425 or a DBI line 420) may be 160 bits, resulting in a 128:160 bit encoding scheme.

Figure 5:
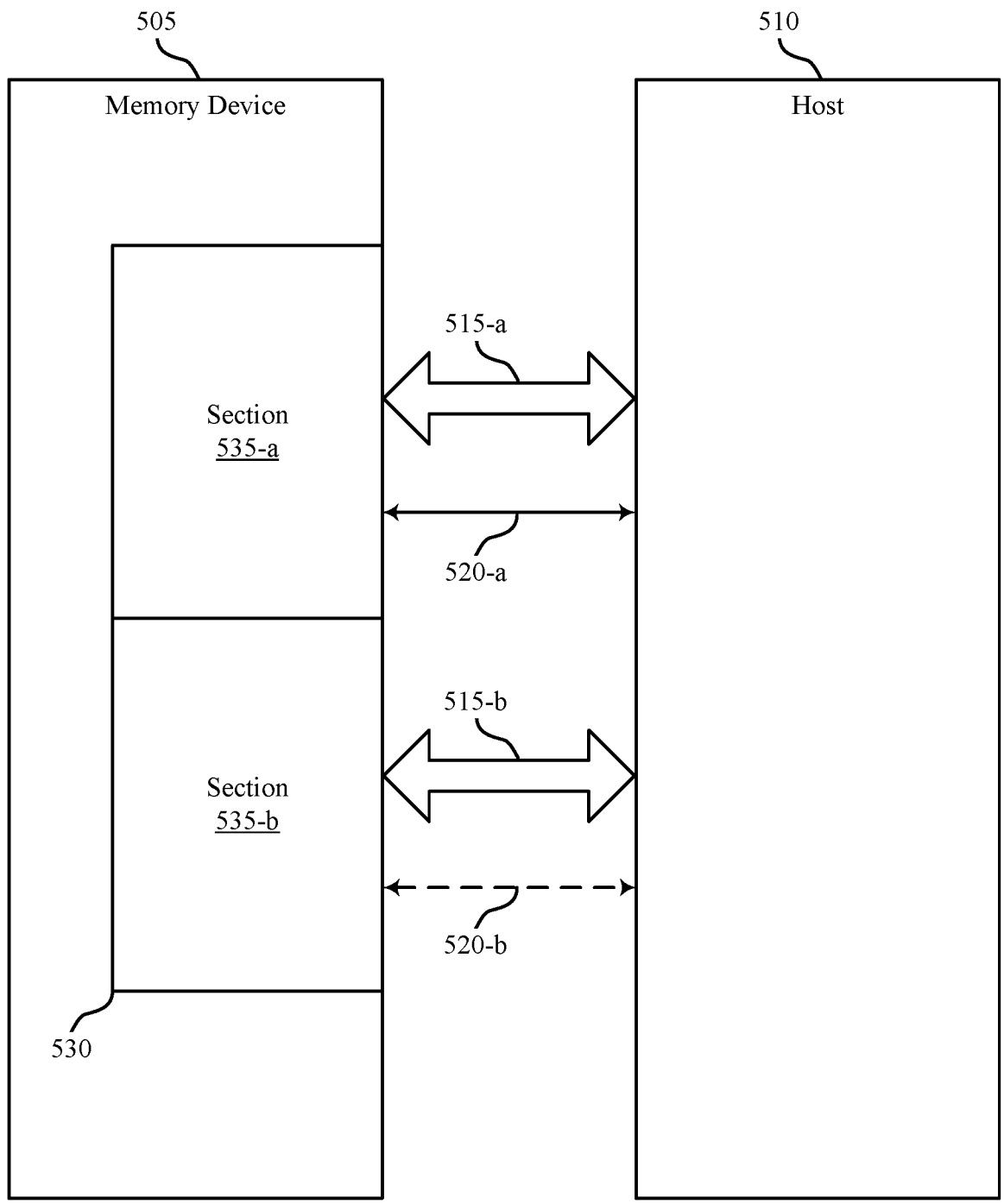
FIG. 5 illustrates an example of a device configuration that supports multiple memory die techniques in accordance with examples as disclosed herein.

FIG. 5 illustrates an example of a device configuration 500 that supports multiple memory die techniques in accordance with examples as disclosed herein. Device configuration 500 may be an example of a communications configuration of a memory device 505, including P2P connections to a host device 510. In some cases, a memory device 505 may be, include, or be included in an example of memory device 110, 200, 305, or 405, as described with reference to FIGS. 1-4. In some cases, the host device 510 and the memory device 505 together may implement aspects of memory device 110 or 200, as described with reference to FIGS. 1 and 2. In some cases, memory device 505 may be an example of a DRAM memory device. Memory device 505 and host device 510 may employ device configuration 500 to transfer data in a full I/O mode or a half I/O mode (e.g., clamshell mode), or any combination thereof.

As described with reference to FIG. 3, a channel for data transfer between a memory device 505 and a host device 510 may be associated with a number of data lines 515 and associated with one or more auxiliary lines (e.g., auxiliary lines 520). A channel may be a logical or physical entity used to transfer data between the memory device 505 and the host device 510 using a full I/O mode or a half I/O mode. In one example of a full I/O mode, a channel may include eight data lines 515, where the eight data lines 515 may be coupled with one memory die 530 of the memory device 505 (e.g., via data pins and device connections to the memory die 530). In one example of a half I/O mode, a channel may include eight data lines 515, where four of the data lines 515 may be coupled with a first memory die 530 and four of the data lines 515 may be coupled with a second memory die 530. In some modes, the host device 510 may also be coupled with a second memory device (not shown). For example, the host device 510 may be coupled with a memory die 530 on memory device 505 via four data lines 515 and an auxiliary line 520, and may be coupled with a memory die 530 on the second memory device in a similar manner.

An auxiliary line 520, as described herein, may be configured to communicate tracking information (e.g., an EDC hold pattern), coding (e.g., DBI coding), error detection information (e.g., using a CRC code), timing information, and other information that may transmitted over an EDC line or a DBI line. An auxiliary line 520 may further be configured to transmit a number of signals equal to the combined number of signals transmitted over an EDC line and a DBI line for one access command.

A memory die 530 on a memory device 505 may include one or more independent I/O sections 535 (e.g., including 535-a and 535-b) that may individually transmit, receive, or operate in a silent mode. Each section 535 of the memory die 530 may be coupled with half of the data pins associated with a channel (e.g., coupled with four pins, which in some cases may each be a subset of a set of eight pins associated with the channel). Each section 535 of the memory die 530 may also be coupled with a corresponding auxiliary line 520 (e.g., via an auxiliary pin and device connections to the memory die 530). For example, section 535-a may be coupled with one auxiliary pin corresponding to auxiliary line 520-a and four data pins corresponding to four data lines 515-a (e.g., pins for half of the data lines 515-a corresponding to a channel). Similarly, section 535-b may be coupled with one auxiliary pin corresponding to auxiliary line 520-b and four data pins corresponding to four data lines 515-b. In such cases, each auxiliary line 520 may be dedicated to transfer auxiliary information associated with the respective data transferred via data lines 515 of the same section 535.

Additionally or alternatively, one section 535 of the memory die 530 (e.g., section 535-b) may not be coupled with any auxiliary pins, but may be coupled with four data pins corresponding to four data lines 515-b. In such cases, auxiliary line 520-a may be dedicated to transfer auxiliary information associated with the data transferred via both data lines 515-a and data lines 515-b. In some cases, where one section 535 is not coupled with any auxiliary pins, memory device 505 may be configured with one set of auxiliary pins associated with each memory die 530, which may simplify manufacturing and setup.

In some cases, benefits may be realized from a memory device 505 configured with two sets of auxiliary pins per channel that may each be coupled with the memory die 530. For example, in a full I/O mode or a half I/O mode, the host device 510 may be coupled with one or both of auxiliary lines 520-*a* and 520-*b*. In cases where the host device 510 is coupled with both auxiliary lines 520-*a* and 520-*b*, the two auxiliary lines 520 may be leveraged to simplify control transmissions, increase space for encoding, and transmit additional information associated with an access command (e.g., increase functionality of an auxiliary line 520 due to extra bandwidth). In some cases, an access command may cause the memory device 505 to read or write 32 bits of information per data line 515, such that data lines 515-*a* and 515-*b* may each transfer 128 bits per access command (e.g., 32 bits over four data lines 515). The total available number of bits on the I/O of each section 535 (e.g., via auxiliary line 520) may be 160 bits, resulting in a 128:160 bit encoding scheme.

Figure 6:
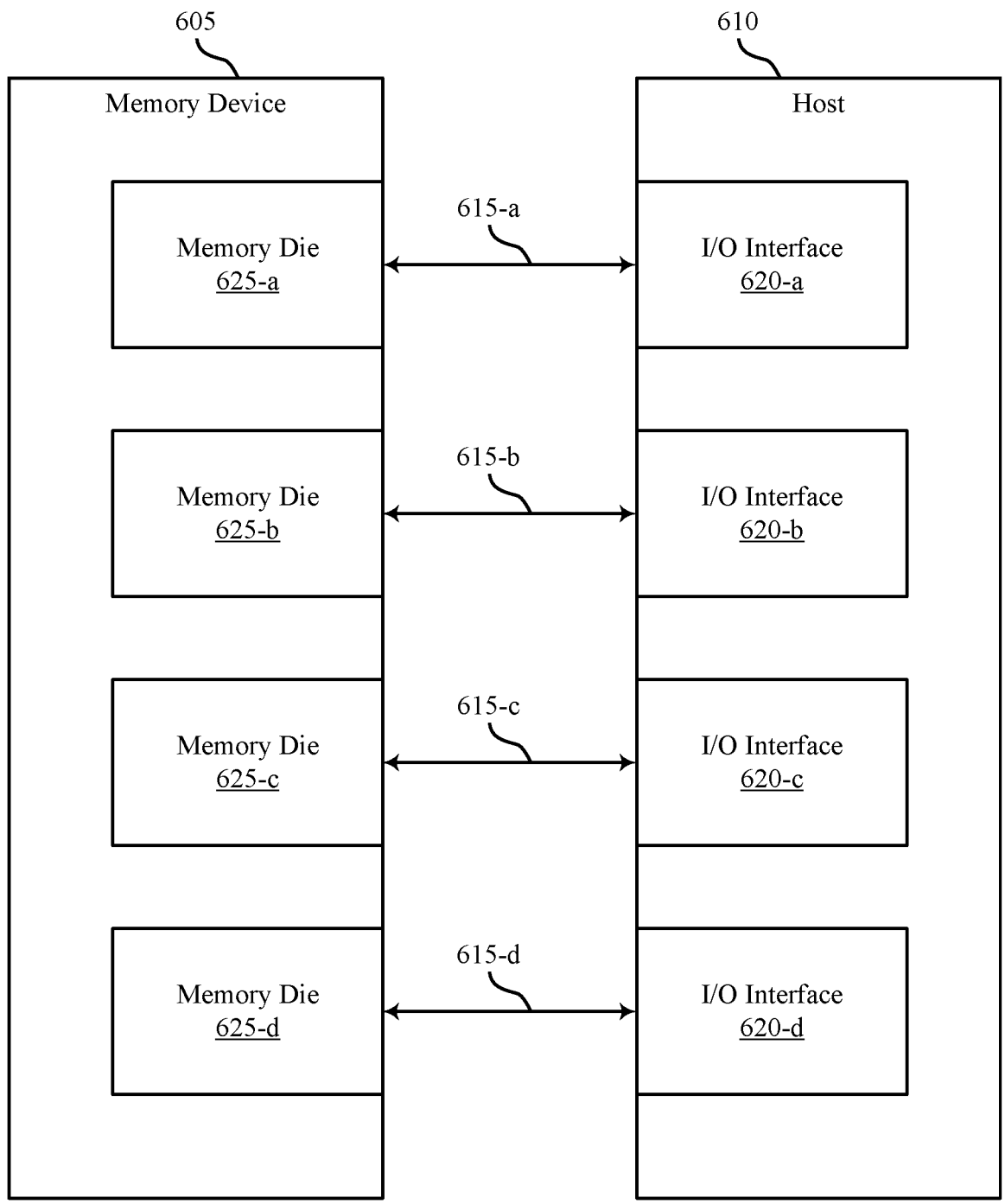
FIG. 6 illustrates an example of a communications configuration that supports multiple memory die techniques in accordance with examples as disclosed herein.

FIG. 6 illustrates an example of a communications configuration 600 that supports multiple memory die techniques in accordance with examples as disclosed herein. Communications configuration 600 may be implemented by a memory device 605 and a host device 610 (e.g., an external memory controller of a device), where data or information may be communicated between the host device 610 and the memory device 605 over one or more channels. In some cases, memory device 605 may be, include, or be included in an example of a memory device 110, 200, 305, 405, or 505 as described with reference to FIGS. 1-5. In some cases, memory device 605 may be an example of a DRAM memory device. Memory device 605 and host device 610, and a system that includes memory device 605 and host device 610, may implement the communications configuration 600 when operating in a full I/O mode to read and write data. In some cases, the host device 610 may be coupled with one or more memory devices 605 (e.g., may implement the communications configuration 600 with multiple memory devices 605) to implement a full I/O mode.

As described with reference to FIG. 3, a memory device 605 may be configured with a number of data pins (e.g., as fixed by physical constraints). A host device 610 or the memory device 605 may transfer data using channels (e.g., independently configured data transfer entities) in a full I/O mode, where each channel may include or be associated with some number of data lines 615 (e.g., eight data lines 615). In one example, a memory device 605 may be configured with 32 data pins, which may be grouped into four sets of eight data pins. Additionally or alternatively, a memory device 605 may be configured with any number of data pins, such as multiples of four data pins or multiples of eight data pins. In some cases, each set of eight data pins may be coupled with a corresponding set of eight data lines 615, which may be included in a same channel. In accordance with the full I/O mode, all the data pins in each set of eight data pins at the memory device 605 may be associated with a channel and used for data transfer. As described with reference to FIG. 3, in accordance with the full I/O mode, data lines 615 may also be coupled with each data pin associated with a memory die 625, where each set of eight data pins may represent the data pins associated with a memory die 625. As such, each memory die 625 may be coupled with a number of data lines 615 corresponding to a channel (e.g., eight data lines 615).

The host device 610 may also be configured with data pins (e.g., as part of an I/O interface 620) that may be coupled with data lines 615 (e.g., data lines 615 associated with a channel). As such, an I/O interface 620 of the host device 610 may be coupled with one or more memory dies 625 of the memory device 605. In some examples, each I/O interface 620 may represent groups of eight data pins, where an I/O interface 620 of eight data pins may be an individual I/O component or part of a collective I/O component on the host device 610. In some cases, each set of eight data pins at the memory device 605 or the host device 610 may be associated with one or more auxiliary pins, which may be used for encoding, tracking, error checking, etc., such as described with reference to FIG. 2. Each auxiliary pin at the memory device 605 may be coupled with a corresponding auxiliary pin at the host device 610 via a corresponding auxiliary line (not shown). Various auxiliary pin and related auxiliary line configurations that may be implemented in communications configuration 600 are described in more detail with reference to FIGS. 3-5.

In communications configuration 600, four channels may be used to transfer data between the memory device 605 and the host device 610, such that each channel may be associated with (e.g., include) one quarter of the total number of data lines 615 coupled with the memory device 605 and the host device 610. In some examples, a number of channels greater than or less than four channels may be used to transfer data between the memory device 605 and the host device 610. In some examples, the a host device 610 may transfer data to or receive data from multiple memory devices 605 over one or more channels.

In one example, each channel may be associated with eight data pins, one or more auxiliary pins (e.g., DBI, EDC, and/or other auxiliary pins), and the corresponding data and auxiliary lines. The pins corresponding to one channel or one memory die 625 may be configured according to one or more device configurations described with reference to FIGS. 3-5. In such cases, auxiliary pins (including the DBI, EDC, and/or other auxiliary pins) may be dedicated to the eight data lines 615 of each channel.

As illustrated, a set of data lines 615-*a* associated with a first channel (e.g., channel A) may couple an I/O interface 620-*a* of the host device 610 with a memory die 625-*a* of the memory device 605 (e.g., may couple the devices via the corresponding lines and pins). Similarly, a set of data lines 615-*b* associated with a second channel may couple an I/O interface 620-*b* with a memory die 625-*b*, and so forth with data lines 615-*c* and 615-*d*. Thus, each of the four channels may be associated with a separate memory die 625-*a* through 625-*d*, respectively, and each channel may be associated with eight data lines 615. Through the use of communications configuration 600, a lower number of data lines 615 may be associated with one channel, and one access command may maintain a particular data rate and packet size even if a higher number of bits are transferred with each access command signal.

Figure 7:
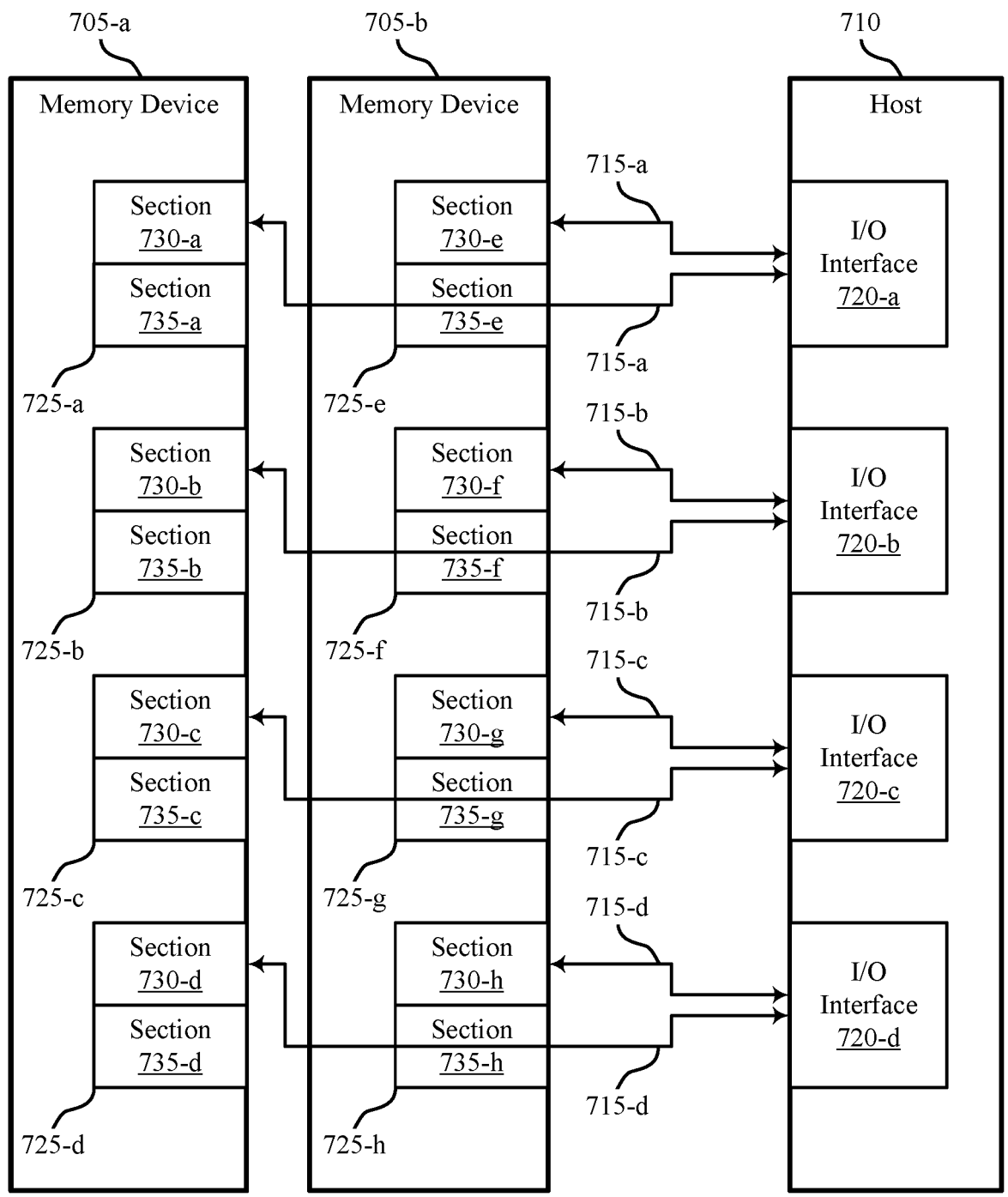
FIG. 7 illustrates an example of a communications configuration that supports multiple memory die techniques in accordance with examples as disclosed herein.

FIG. 7 illustrates an example of a communications configuration 700 that supports multiple memory die techniques in accordance with examples as disclosed herein. Communications configuration 700 may be implemented by a host device 710 (e.g., an external memory controller of a device) and one or more memory devices 705 (e.g., memory device 705-*a* and 705-*b*), where data or information may be communicated between the host device 710 and one or both of the memory devices 705 over one or more channels. In some cases, a memory device 705 may be, include, or be included in an example of a memory device 110, 200, 305, 405, 505, or 605 as described with reference to FIGS. 1-6. In some cases, memory devices 705 may be examples of a DRAM memory device. In some examples, memory device 705-*a* may be referred to as a top memory device 705 and in some cases, may be a DRAM located at the top of a PCB. In some examples, memory device 705-*b* may be referred to as a bottom memory device 705 and in some cases, may be a DRAM located at the bottom of the PCB (e.g., in a clamshell layout). Memory device 705-*a*, memory device 705-*b*, and host device 710, and a system that includes memory devices 705 and host device 710, may implement the communications configuration 700 when operating in a half I/O mode (e.g., as part of a clamshell mode) to read and write data. In some cases, the host device 710 may be coupled with more than two memory devices 705 to implement a half I/O mode.

As described with reference to FIG. 3, a memory device 705 may be configured with a number of data pins (e.g., as fixed by physical constraints). A host device 710 or the memory device 705 may transfer data using channels (e.g., independently configured data transfer entities) in a half I/O mode, where each channel may include or be associated with some number of data lines 715 (e.g., eight data lines 715). In one example, a memory device 705 may be configured with 32 data pins, which may be grouped into four sets of eight data pins. Additionally or alternatively, a memory device 705 may be configured with any number of data pins, such as multiples of four data pins or multiples of eight data pins. As described with reference to FIG. 3, each set of eight data pins may represent the data pins associated with a memory die 725.

In accordance with the half I/O mode, half of the data pins (e.g., four data pins) in each set of eight data pins may be coupled with a corresponding set of four data lines 715, which may be included in a same channel. Half of the data pins (e.g., four data pins) in each set of eight data pins on another memory device 705 may be coupled with a corresponding set of four data lines 715, which may be included in a same channel. In some cases, two sets of four data lines 715 from two separate memory devices 705 (e.g., memory device 705-*a* and 705-*b*) may be associated with a same channel, such that the channel may include eight total data lines 715, with four data lines 715 coupled with each memory device 705. Four data lines 715 associated with the same channel and coupled with a memory device 705 may be coupled with a same memory die 725 of the memory device, such that half of the data pins associated with the memory die are coupled with the data lines 715 (e.g., in a half I/O mode). As such, each memory die 725 may be coupled with half of a number of data lines 715 corresponding to a channel (e.g., four data lines 715).

The host device 710 may also be configured with data pins (e.g., as part of an I/O interface 720) that may be coupled with data lines 715 (e.g., data lines 715 associated with a channel). As such, an I/O interface 720 of the host device 710 may be coupled with one or more memory dies 725 of the memory device 705. In some examples, each I/O interface 720 may represent groups of eight data pins, where an I/O interface 720 of eight data pins may be an individual I/O component or part of a collective I/O component on the host device 710. In some cases, each set of eight data pins at the memory device 705 or the host device 710 may be associated with one or more auxiliary pins, which may be used for encoding, tracking, error checking, etc., such as described with reference to FIG. 2. Each auxiliary pin at the memory device 705 may be coupled with a corresponding auxiliary pin at the host device 710 via a corresponding auxiliary line (not shown). Auxiliary pin and related auxiliary line configurations that may be used for communications configuration 700 are described in more detail with reference to FIGS. 3-5.

In communications configuration 700, four channels may be used to transfer data between the memory device 705 and the host device 710, such that each channel may be associated with (e.g., include) one quarter of the total number of data lines 715 coupled with the memory device 705 and the host device 710. In some examples, a number of channels greater than or less than four channels may be used to transfer data between the memory device 705 and the host device 710. In some examples, the host device 710 may be transfer data to or receive data from multiple memory devices 705 over one or more channels.

In one example, each channel may be associated with eight data pins, one or more auxiliary pins (e.g., DBI, EDC, and/or other auxiliary pins), and the corresponding data and auxiliary lines. The pins corresponding to one channel or one memory die 725 may be configured according to one or more device configurations described with reference to FIGS. 3-5. In such cases, auxiliary pins (including the DBI, EDC, and/or other auxiliary pins) may be dedicated to the four data lines 715 of each channel coupled with one memory die 725.

As illustrated, in a half I/O mode, a set of data lines 715-*a* associated with a first channel (e.g., channel A) may couple an I/O interface 720-*a* of the host device 710 with a memory die 725-*a* of memory device 705-*a* and a memory die 725-*e* of memory device 705-*b* (e.g., may couple the devices via the corresponding lines and pins). Similarly, a set of data lines 715-*b* associated with a second channel may couple an I/O interface 720-*b* with memory dies 725-*b* and 725-*f*, and so forth with data lines 715-*c* and 715-*d*. Thus, each of the four channels may be associated with two separate memory dies 725, and each channel may be associated with eight data lines 715 (e.g., with four data lines 715 coupled with each of the two memory dies 725). The channels may be associated with a first section 730 of each memory die 725 with the corresponding I/O interface 720 of the host device 710, as described with reference to FIGS. 4 and 5. For example, a section 730-*a* of memory die 725-*a* may be coupled with four data lines 715 and corresponding auxiliary lines (e.g., via the pins associated with section 730-*a*), while a section 735-*a* of memory die 725-*a* may not be coupled with any data lines 715. Through the use of communications configuration 700, a lower number of data lines 715 may be associated with one channel, and one access command may maintain a particular data rate and packet size even if a higher number of bits are transferred with each access command signal.

Figure 8:
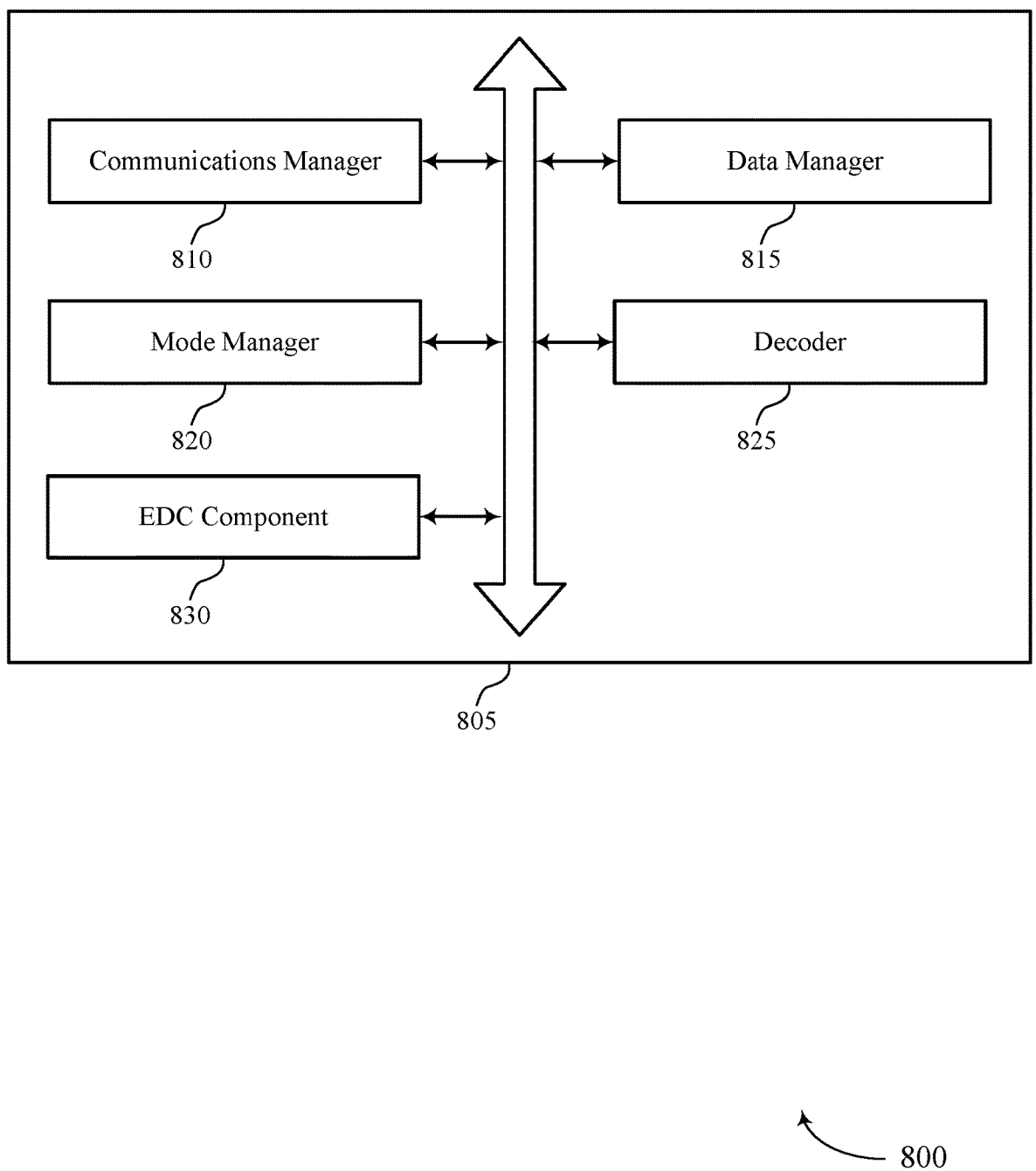
FIG. 8 shows a block diagram of a memory device that supports multiple memory die techniques in accordance with aspects of the present disclosure.

FIG. 8 shows a block diagram 800 of a memory device 805 that supports multiple memory die techniques in accordance with examples as disclosed herein. The memory device 805 may be an example of aspects of a memory device as described with reference to FIGS. 1-7. The memory device 805 may include a communications manager 810, a data manager 815, a mode manager 820, a decoder 825, and an EDC component 830. Each of these modules may communicate, directly or indirectly, with one another (e.g., via one or more buses).

The communications manager 810 may communicate, between a first memory die and a host device, first data via a first set of four data pins and channel coding information for the first data via a first auxiliary pin corresponding to the first set of four data pins. In some examples, the communications manager 810 may communicate, between a second memory die and the host device, second data via a second set of four data pins and channel coding information for the second data via a second auxiliary pin corresponding to the second set of four data pins.

The data manager 815 may receive the first data via the first set of four data pins. In some examples, the data manager 815 may identify the first data based on the channel coding information for the first data, where the channel coding information for the first data may include data coding information for the first data. In such cases, the first auxiliary pin may include a data coding pin.

The mode manager 820 may determine, based on one or more access commands, a first mode for the first set of four data pins, where communicating the first data is based on the first mode. In some examples, the mode manager 820 may determine, based on the one or more access commands, a second mode for the second set of four data pins, where communicating the second data is based on the second mode. In some cases, the first mode and the second mode each include at least one of a transmit mode, a receive mode, or a silent mode.

The decoder 825 may decode the first data based on the channel coding information for the first data, where the channel coding information for the first data includes EDC information for the first data, data coding information for the first data, or any combination thereof.

The EDC component 830 may transmit, from the first memory die to the host device, EDC information via an EDC pin for the first set of four data pins, where the EDC information is based on identifying the first data.

Figure 9:
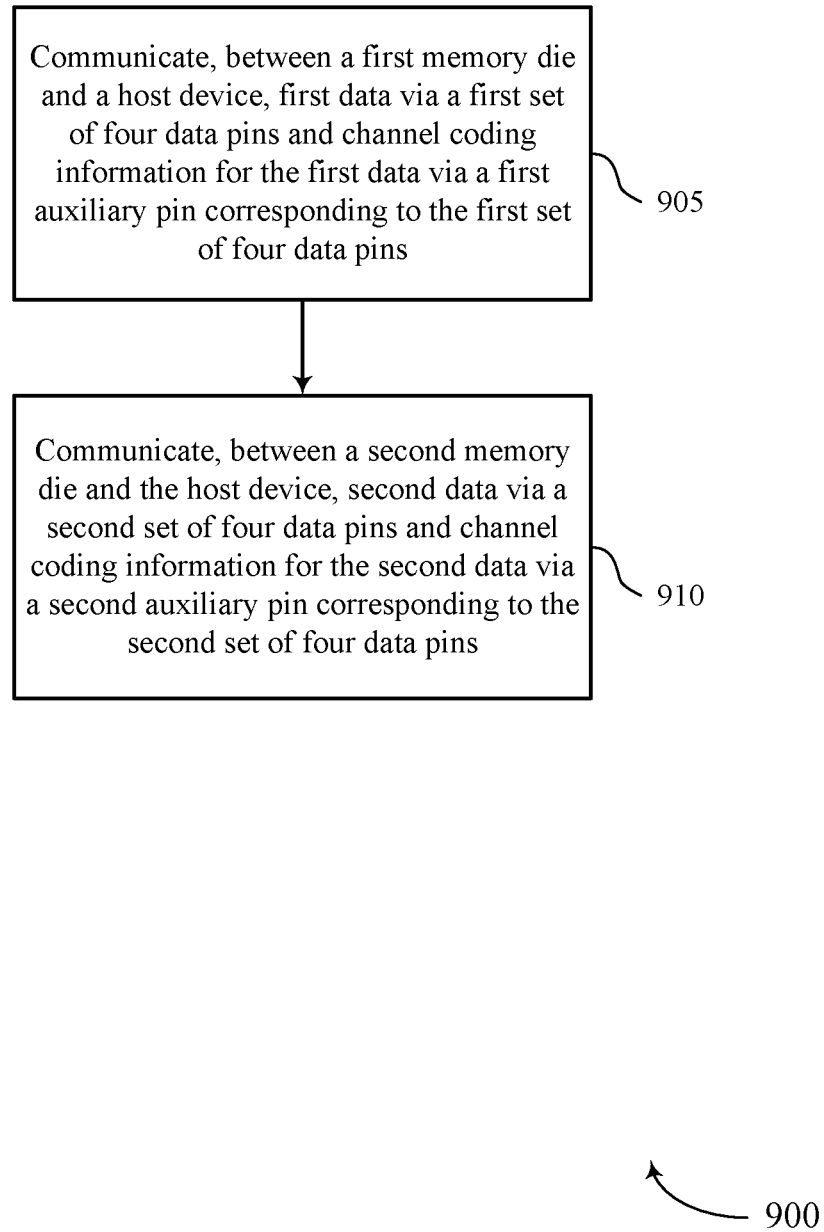
FIGS. 9 through 11 show flowcharts illustrating a method or methods that support multiple memory die techniques in accordance with examples as disclosed herein.

FIG. 9 shows a flowchart illustrating a method or methods 900 that supports multiple memory die techniques in accordance with aspects of the present disclosure. The operations of method 900 may be implemented by a memory device or its components as described herein. For example, the operations of method 900 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 905, the memory device may communicate, between a first memory die and a host device, first data via a first set of four data pins and channel coding information for the first data via a first auxiliary pin corresponding to the first set of four data pins. The operations of 905 may be performed according to the methods described herein. In some examples, aspects of the operations of 905 may be performed by a communications manager as described with reference to FIG. 8.

At 910, the memory device may communicate, between a second memory die and the host device, second data via a second set of four data pins and channel coding information for the second data via a second auxiliary pin corresponding to the second set of four data pins. The operations of 910 may be performed according to the methods described herein. In some examples, aspects of the operations of 910 may be performed by a communications manager as described with reference to FIG. 8.

In some examples, an apparatus as described herein may perform a method or methods, such as the method 900. The apparatus may include features, means, or instructions (e.g., a non-transitory computer-readable medium storing instructions executable by a processor) for communicating, between a first memory die and a host device, first data via a first set of four data pins and channel coding information for the first data via a first auxiliary pin corresponding to the first set of four data pins and communicating, between a second memory die and the host device, second data via a second set of four data pins and channel coding information for the second data via a second auxiliary pin corresponding to the second set of four data pins.

In some examples of the method 900 and the apparatus described herein, communicating the first data may include operations, features, means, or instructions for receiving the first data via the first set of four data pins, the method further including.

In some examples of the method 900 and the apparatus described herein, communicating the first data may include operations, features, means, or instructions for receiving the first data via the first set of four data pins, the method further including.

Some examples of the method 900 and the apparatus described herein may further include operations, features, means, or instructions for determining, based on one or more access commands, a first mode for the first set of four data pins, where communicating the first data may be based on the first mode, and determining, based on the one or more access commands, a second mode for the second set of four data pins, where communicating the second data may be based on the second mode.

In some examples of the method 900 and the apparatus described herein, the first mode and the second mode each include at least one of a transmit mode, a receive mode, or a silent mode.

Figure 10:
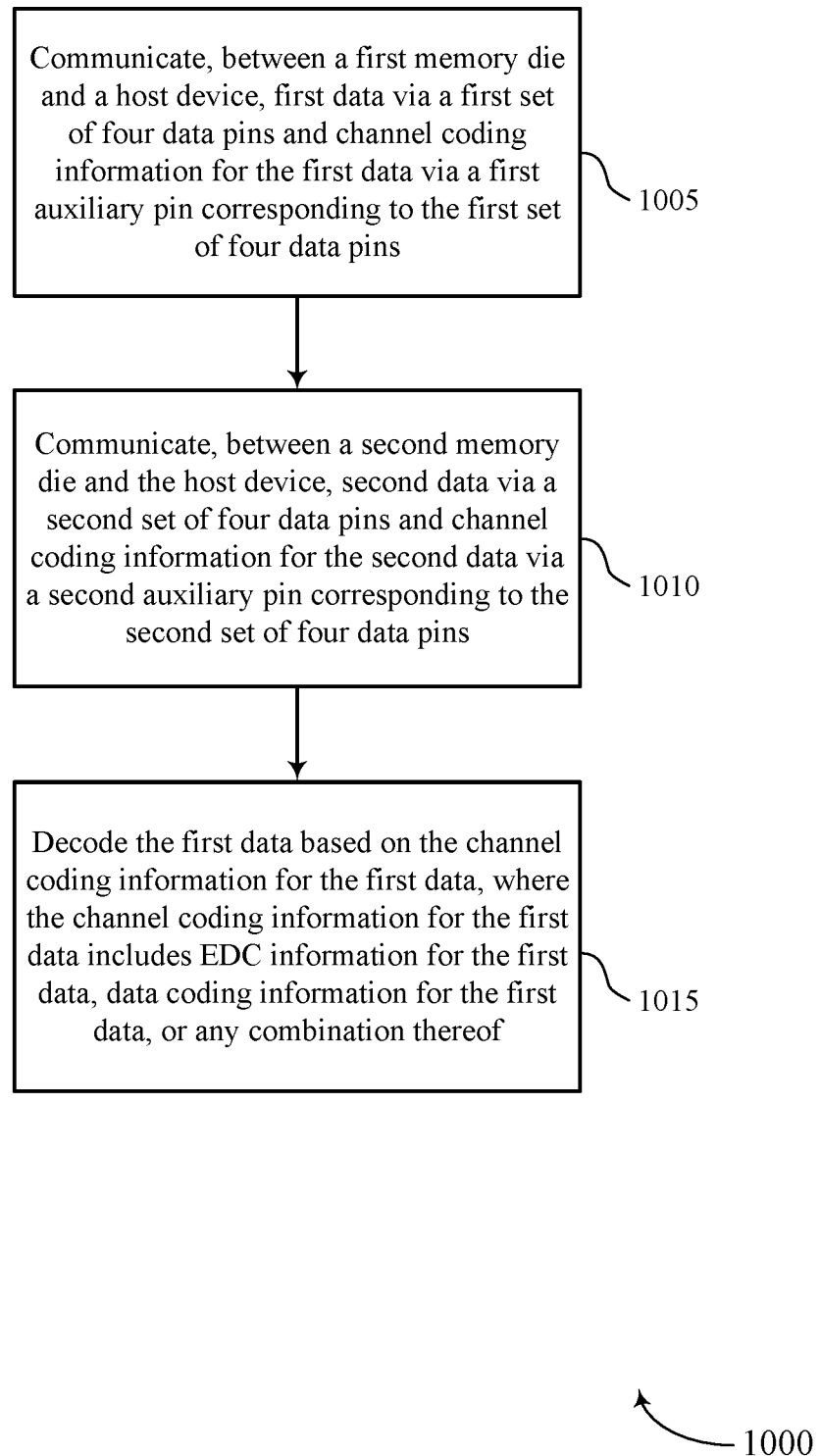

FIG. 10 shows a flowchart illustrating a method or methods 1000 that supports multiple memory die techniques in accordance with aspects of the present disclosure. The operations of method 1000 may be implemented by a memory device or its components as described herein. For example, the operations of method 1000 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 1005, the memory device may communicate, between a first memory die and a host device, first data via a first set of four data pins and channel coding information for the first data via a first auxiliary pin corresponding to the first set of four data pins. The operations of 1005 may be performed according to the methods described herein. In some examples, aspects of the operations of 1005 may be performed by a communications manager as described with reference to FIG. 8.

At 1010, the memory device may communicate, between a second memory die and the host device, second data via a second set of four data pins and channel coding information for the second data via a second auxiliary pin corresponding to the second set of four data pins. The operations of 1010 may be performed according to the methods described herein. In some examples, aspects of the operations of 1010 may be performed by a communications manager as described with reference to FIG. 8.

At 1015, the memory device may decode the first data based on the channel coding information for the first data, where the channel coding information for the first data includes EDC information for the first data, data coding information for the first data, or any combination thereof. The operations of 1015 may be performed according to the methods described herein. In some examples, aspects of the operations of 1015 may be performed by a data manager as described with reference to FIG. 8.

Figure 11:
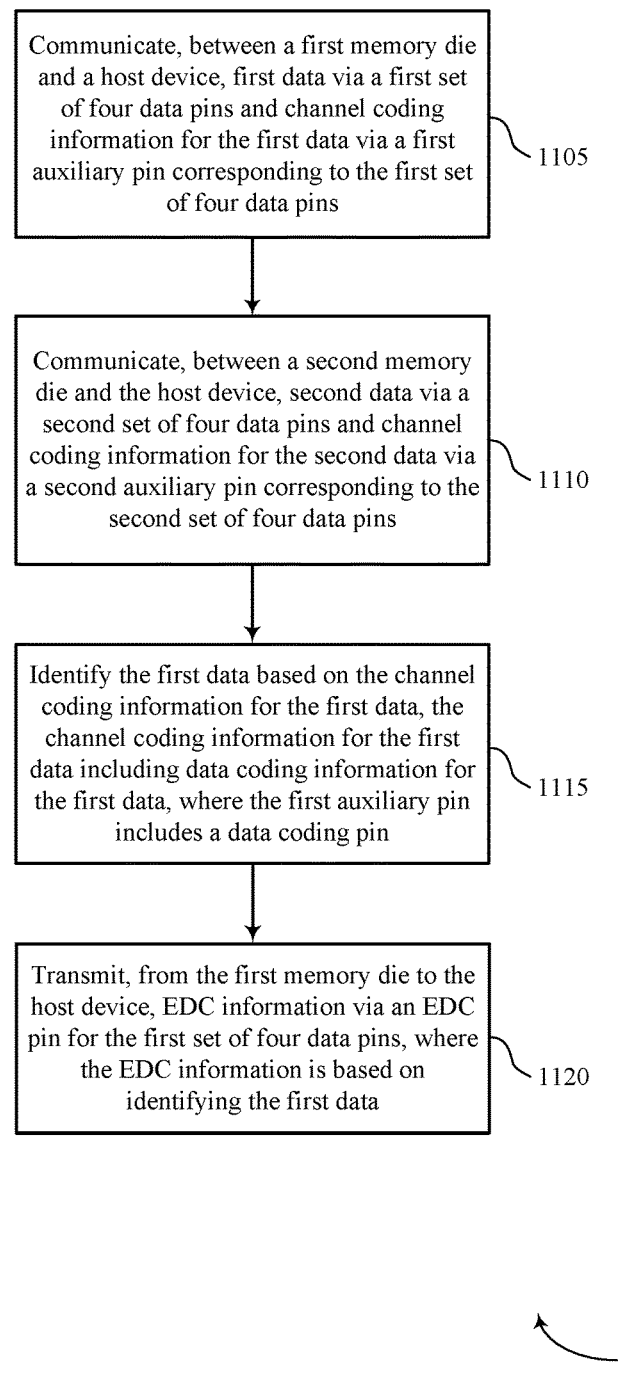

FIG. 11 shows a flowchart illustrating a method or methods 1100 that supports multiple memory die techniques in accordance with aspects of the present disclosure. The operations of method 1100 may be implemented by a memory device or its components as described herein. For example, the operations of method 1100 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 1105, the memory device may communicate, between a first memory die and a host device, first data via a first set of four data pins and channel coding information for the first data via a first auxiliary pin corresponding to the first set of four data pins. The operations of 1105 may be performed according to the methods described herein. In some examples, aspects of the operations of 1105 may be performed by a communications manager as described with reference to FIG. 8.

At 1110, the memory device may communicate, between a second memory die and the host device, second data via a second set of four data pins and channel coding information for the second data via a second auxiliary pin corresponding to the second set of four data pins. The operations of 1110 may be performed according to the methods described herein. In some examples, aspects of the operations of 1110 may be performed by a communications manager as described with reference to FIG. 8.

At 1115, the memory device may identify the first data based on the channel coding information for the first data, the channel coding information for the first data including data coding information for the first data, where the first auxiliary pin includes a data coding pin. The operations of 1115 may be performed according to the methods described herein. In some examples, aspects of the operations of 1115 may be performed by a data manager as described with reference to FIG. 8.

At 1120, the memory device may transmit, from the first memory die to the host device, EDC information via an EDC pin for the first set of four data pins, where the EDC information is based on identifying the first data. The operations of 1120 may be performed according to the methods described herein. In some examples, aspects of the operations of 1120 may be performed by an EDC component as described with reference to FIG. 8.

It should be noted that the methods described herein describe possible implementations, and that the operations and the steps may be rearranged or otherwise modified and that other implementations are possible. Further, portions from two or more of the methods may be combined.

An apparatus is described. The apparatus may include a memory device including a set of memory dies, each memory die of the set operable to communicate with a host device via a set of eight data pins including a first subset of four data pins and a second subset of four data pins, the first subset of four data pins and the second subset of four data pins operable to be independently addressed and an auxiliary pin operable to carry channel coding information for the first subset of four data pins.

In some examples, the channel coding information for the first subset of four data pins includes EDC signaling for the first subset of four data pins, data coding signaling for the first subset of four data pins, or any combination thereof. In some examples, the data coding signaling and the EDC signaling may be encoded in accordance with a same encoding scheme. Some examples of the apparatus may include a second auxiliary pin operable to carry second channel coding information for the second subset of four data pins. Some examples of the apparatus may include a second auxiliary pin operable to carry second channel coding information for the first subset of four data pins.

In some examples, the auxiliary pin may be operable to carry data coding signaling for the first subset of four data pins, and the second auxiliary pin may be operable to carry EDC signaling for the first subset of four data pins. In some examples, the data coding signaling indicates DBI information for data communicated via the first subset of four data pins. In some examples, the EDC signaling indicates tracking information, a hold pattern, a CRC code, or a combination thereof for data communicated via the first subset of four data pins. Some examples of the apparatus may include a second EDC pin operable to carry EDC signaling for the second subset of four data pins, where the auxiliary pin includes a first EDC pin.

Some examples of the apparatus may include a second data coding pin operable to carry second data coding signaling for the second subset of four data pins, where the second auxiliary pin includes a first data coding pin. In some examples, the auxiliary pin and the second auxiliary pin may be further operable to carry the channel coding information and second channel coding information for the set of eight data pins. In some examples, the auxiliary pin may be further operable to carry second channel coding information for the set of eight pins, the second channel coding information including EDC signaling and data coding signaling for the set of eight pins. Some examples of the apparatus may include a first transceiver operable to communicate first data via the first subset of four data pins based on the channel coding information for the first subset of four data pins, and a second transceiver operable to communicate second data via the second subset of four data pins based on second channel coding information for the second subset of four data pins.

An apparatus is described. The apparatus may include a host device operable to communicate with a set of memory dies, where the host device is operable to communicate with a respective memory die of the set via a set of eight data pins including a first subset of four data pins and a second subset of four data pins, the first subset of four data pins and the second subset of four data pins operable to be independently addressed, and an auxiliary pin operable to carry channel coding information for the first subset of four data pins.

In some examples, the channel coding information for the first subset of four data pins includes EDC signaling and data coding signaling for the first subset of four data pins, the data coding signaling and the EDC signaling being encoded in accordance with a same encoding scheme. Some examples of the apparatus may include a second auxiliary pin operable to carry second channel coding information for the first subset of four data pins, where the auxiliary pin is operable to carry data coding signaling that is for the first subset of four data pins and the second auxiliary pin is operable to carry EDC signaling for the first subset of four data pins.

A system is described. The system may include a memory device that includes a set of memory dies and a host device coupled with the memory device, the system operable to communicate, between the host device and a respective memory die of the set, data via a set of eight data pins including a first subset of four data pins and a second subset of four data pins, the first subset of four data pins and the second subset of four data pins operable to be independently addressed and communicate, with the respective memory die, channel coding information for the first subset of four data pins via an auxiliary pin.

In some examples, the system may be further operable to communicate, between the host device and the respective memory die, second channel coding information for the second subset of four data pins via a second auxiliary pin.

In some examples, the system may be further operable to communicate, between the host device and the respective memory die, second channel coding information for the first subset of four data pins via a second auxiliary pin.

In some examples, the system may further include a second memory device coupled with the host device and including a second set of memory dies, the system further operable to communicate, between the host device and the respective memory die of the set, the data via the first subset of four data pins, and communicate, between the host device and a respective second memory die of the second set, second data via a third subset of four data pins included in a second set of eight data pins at the second memory device, and communicate, with the respective second memory die, second channel coding information for the second subset of four data pins via a second auxiliary pin.

Though in some cases aspects of the teachings herein may be illustrated by reference to examples consistent with one or more types of memory devices (e.g., DRAM devices), it will be understood by a person of ordinary skill in the art that the teachings herein may be applied to any type of memory device as well as to any electronic system in which data is communicated (e.g., between devices within the system).

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a memory device comprising a set of memory dies, each memory die of the set operable to communicate with a host device via:
   a set of eight data pins comprising a first subset of four data pins and a second subset of four data pins, the first subset of four data pins and the second subset of four data pins operable to be independently addressed; and
   an auxiliary pin operable to carry channel coding information for the first subset of four data pins.

2. The apparatus of claim 1, wherein the channel coding information for the first subset of four data pins comprises error detection code (EDC) signaling for the first subset of four data pins, data coding signaling for the first subset of four data pins, or any combination thereof.

3. The apparatus of claim 2, wherein the data coding signaling and the EDC signaling are encoded in accordance with a same encoding scheme.

4. The apparatus of claim 2, further comprising:
   a second auxiliary pin operable to carry second channel coding information for the second subset of four data pins.

5. The apparatus of claim 1, further comprising:
   a second auxiliary pin operable to carry second channel coding information for the first subset of four data pins.

6. The apparatus of claim 5, wherein:
   the auxiliary pin is operable to carry data coding signaling for the first subset of four data pins; and
   the second auxiliary pin is operable to carry error detection code (EDC) signaling for the first subset of four data pins.

7. The apparatus of claim 6, wherein the data coding signaling indicates data bus inversion (DBI) information for data communicated via the first subset of four data pins.

8. The apparatus of claim 6, wherein the EDC signaling indicates tracking information, a hold pattern, a cyclic redundancy check (CRC) code, or a combination thereof for data communicated via the first subset of four data pins.

9. The apparatus of claim 5, further comprising:
a second error detection code (EDC) pin operable to carry EDC signaling for the second subset of four data pins, wherein the auxiliary pin comprises a first EDC pin.

10. The apparatus of claim 9, further comprising:
a second data coding pin operable to carry second data coding signaling for the second subset of four data pins, wherein the second auxiliary pin comprises a first data coding pin.

11. The apparatus of claim 5, wherein the auxiliary pin and the second auxiliary pin are further operable to carry the channel coding information and second channel coding information for the set of eight data pins.

12. The apparatus of claim 1, wherein the auxiliary pin is further operable to carry second channel coding information for the set of eight data pins, the second channel coding information comprising error detection code (EDC) signaling and data coding signaling for the set of eight data pins.

13. The apparatus of claim 1, further comprising:
a first transceiver operable to communicate first data via the first subset of four data pins based at least in part on the channel coding information for the first subset of four data pins; and
a second transceiver operable to communicate second data via the second subset of four data pins based at least in part on second channel coding information for the second subset of four data pins.

14. An apparatus, comprising:
a host device operable to communicate with a set of memory dies, wherein the host device is operable to communicate with a respective memory die of the set via:
a set of eight data pins comprising a first subset of four data pins and a second subset of four data pins, the first subset of four data pins and the second subset of four data pins operable to be independently addressed; and
an auxiliary pin operable to carry channel coding information for the first subset of four data pins.

15. The apparatus of claim 14, wherein the channel coding information for the first subset of four data pins comprises error detection code (EDC) signaling and data coding signaling for the first subset of four data pins, the data coding signaling and the EDC signaling being encoded in accordance with a same encoding scheme.

16. The apparatus of claim 14, further comprising:
a second auxiliary pin operable to carry second channel coding information for the first subset of four data pins, wherein:
the auxiliary pin is operable to carry data coding signaling that is for the first subset of four data pins; and
the second auxiliary pin is operable to carry error detection code (EDC) signaling for the first subset of four data pins.

17. A method, comprising:
communicating, between a first memory die and a host device, first data via a first set of four data pins and channel coding information for the first data via a first auxiliary pin corresponding to the first set of four data pins; and
communicating, between a second memory die and the host device, second data via a second set of four data pins and channel coding information for the second data via a second auxiliary pin corresponding to the second set of four data pins.

18. The method of claim 17, wherein communicating the first data comprises:
receiving the first data via the first set of four data pins, the method further comprising:
decoding the first data based at least in part on the channel coding information for the first data, wherein the channel coding information for the first data comprises error detection code (EDC) information for the first data, data coding information for the first data, or any combination thereof.

19. The method of claim 17, wherein communicating the first data comprises:
receiving the first data via the first set of four data pins, the method further comprising:
identifying the first data based at least in part on the channel coding information for the first data, the channel coding information for the first data comprising data coding information for the first data, wherein the first auxiliary pin comprises a data coding pin; and
transmitting, from the first memory die to the host device, error detection code (EDC) information via an EDC pin for the first set of four data pins, wherein the EDC information is based at least in part on identifying the first data.

20. The method of claim 17, further comprising:
determining, based at least in part on one or more access commands, a first mode for the first set of four data pins, wherein communicating the first data is based at least in part on the first mode; and
determining, based at least in part on the one or more access commands, a second mode for the second set of four data pins, wherein communicating the second data is based at least in part on the second mode.

21. The method of claim 20, wherein the first mode and the second mode each comprise at least one of a transmit mode, a receive mode, or a silent mode.

22. A system, comprising:
a memory device comprising a set of memory dies; and
a host device coupled with the memory device, the system operable to:
communicate, between the host device and a respective memory die of the set, data via a set of eight data pins comprising a first subset of four data pins and a second subset of four data pins, the first subset of four data pins and the second subset of four data pins operable to be independently addressed; and
communicate, with the respective memory die, channel coding information for the first subset of four data pins via an auxiliary pin.

23. The system of claim 22, wherein the system is further operable to:
communicate, between the host device and the respective memory die, second channel coding information for the second subset of four data pins via a second auxiliary pin.

24. The system of claim 22, wherein the system is further operable to:
communicate, between the host device and the respective memory die, second channel coding information for the first subset of four data pins via a second auxiliary pin.

25. The system of claim 22, further comprising:
a second memory device coupled with the host device and comprising a second set of memory dies, the system further operable to:

communicate, between the host device and the respective memory die of the set, the data via the first subset of four data pins;

communicate, between the host device and a respective second memory die of the second set, second data via a third subset of four data pins included in a second set of eight data pins at the second memory device; and communicate, with the respective second memory die, second channel coding information for the second subset of four data pins via a second auxiliary pin.

* * * * *